(12) United States Patent
Tajima et al.

(10) Patent No.: US 10,658,338 B2
(45) Date of Patent: May 19, 2020

(54) SEMICONDUCTOR DEVICE INCLUDING A RE-INTERCONNECTION LAYER AND METHOD FOR MANUFACTURING SAME

(71) Applicant: TOSHIBA MEMORY CORPORATION, Minato-ku (JP)

(72) Inventors: Takayuki Tajima, Sagamihara (JP); Yoichiro Kurita, Minato (JP); Kazuo Shimokawa, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/058,161

(22) Filed: Aug. 8, 2018

(65) Prior Publication Data

US 2019/0267350 A1  Aug. 29, 2019

(30) Foreign Application Priority Data

Feb. 28, 2018  (JP) ................. 2018-034557

(51) Int. Cl.
 *H01L 23/48* (2006.01)
 *H01L 25/065* (2006.01)
 (Continued)

(52) U.S. Cl.
 CPC ........ *H01L 25/0657* (2013.01); *H01L 21/486* (2013.01); *H01L 21/561* (2013.01);
 (Continued)

(58) Field of Classification Search
 None
 See application file for complete search history.

(56) References Cited

U.S. PATENT DOCUMENTS 8,259,464 B2 * 9/2012 Zhou .................. H01L 23/3171
361/771
2007/0126085 A1  6/2007 Kawano et al.
(Continued)

FOREIGN PATENT DOCUMENTS

JP  2007-180529  7/2007
JP  2014-110337  6/2014
(Continued)

*Primary Examiner* — Hung K Vu
(74) *Attorney, Agent, or Firm* — Oblon, McClelland, Maier & Neustadt, L.L.P.

(57) ABSTRACT

According to one embodiment, a semiconductor device includes a re-interconnection layer, bumps, chips, and a resin member. The bumps are provided on a first surface of the re-interconnection layer. The chips are stacked on a second surface of the re-interconnection layer. The resin member is provided on the second surface, and covers the chips. The re-interconnection layer includes an insulating layer, an interconnection, a first via, an electrode layer, and a second via. The interconnection is provided in the insulating layer. The first via is provided in the insulating layer and connected to the interconnection. The electrode layer is provided in the insulating layer, formed of a metal material different from a material of the first via, exposed on the first surface, and connected to the first via and the bumps. The second via is provided in the insulating layer, and connected to the interconnection and the chips.

11 Claims, 8 Drawing Sheets (51) Int. Cl.
*H01L 23/498* (2006.01)
*H01L 23/31* (2006.01)
*H01L 21/48* (2006.01)
*H01L 25/00* (2006.01)
*H01L 21/56* (2006.01)
*H01L 23/00* (2006.01)
*H01L 21/683* (2006.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/49811* (2013.01); *H01L 23/49827* (2013.01); *H01L 23/49838* (2013.01); *H01L 23/49866* (2013.01); *H01L 24/14* (2013.01); *H01L 24/97* (2013.01); *H01L 25/50* (2013.01); *H01L 24/16* (2013.01); *H01L 24/29* (2013.01); *H01L 24/32* (2013.01); *H01L 24/73* (2013.01); *H01L 24/81* (2013.01); *H01L 24/92* (2013.01); *H01L 2221/68345* (2013.01); *H01L 2224/16145* (2013.01); *H01L 2224/16225* (2013.01); *H01L 2224/16235* (2013.01); *H01L 2224/2919* (2013.01); *H01L 2224/32225* (2013.01); *H01L 2224/73204* (2013.01); *H01L 2224/81001* (2013.01); *H01L 2224/92125* (2013.01); *H01L 2225/06513* (2013.01); *H01L 2225/06517* (2013.01); *H01L 2225/06548* (2013.01); *H01L 2225/06565* (2013.01); *H01L 2225/06586* (2013.01); *H01L 2924/00014* (2013.01); *H01L 2924/15311* (2013.01); *H01L 2924/15321* (2013.01)

(56) References Cited

U.S. PATENT DOCUMENTS

| | | | |
|---|---|---|---|
| 2009/0309212 | A1* | 12/2009 | Shim, II ................ H01L 21/568 257/700 |
| 2013/0037950 | A1 | 2/2013 | Yu et al. |
| 2013/0241074 | A1* | 9/2013 | Scanlan .................. H01L 24/19 257/773 |
| 2016/0013148 | A1 | 1/2016 | Lin et al. |
| 2016/0079222 | A1 | 3/2016 | Sato |
| 2016/0300813 | A1* | 10/2016 | Zhai ...................... H01L 21/561 |
| 2017/0250171 | A1* | 8/2017 | Yu .......................... H01L 25/50 |

FOREIGN PATENT DOCUMENTS

| | | |
|---|---|---|
| JP | 2016-062995 | 4/2016 |
| JP | 2016-127239 | 7/2016 |

\* cited by examiner

SEMICONDUCTOR DEVICE INCLUDING A RE-INTERCONNECTION LAYER AND METHOD FOR MANUFACTURING SAME

CROSS-REFERENCE TO RELATED APPLICATIONS

This application is based upon and claims the benefit of priority from Japanese Patent Application No. 2018-034557, filed on Feb. 28, 2018; the entire contents of which are incorporated herein by reference.

FIELD

Embodiments described herein relate generally to a semiconductor device and a method for manufacturing the same.

BACKGROUND

Conventionally, a semiconductor device has been manufactured, which multiple memory chips are stacked on a print board and are molded by a resin. Bumps are bonded on a lower surface of the print board and a semiconductor device is mounted in an electronic hardware or the like via the bumps. On the other hand, recently, since a low profile of the semiconductor device has been required, a technology using a re-interconnection layer instead of the print board has been proposed. The re-interconnection layer is formed on a support substrate by a semiconductor process, chips are stacked on the re-interconnection layer, and then the support substrate is removed. An electrode layer is provided on a lower surface of the re-interconnection layer and the bumps are bonded to the electrode layer. However, warpage is easily to occur in the re-interconnection layer after removal of the support substrate, and it is difficult to form the electrode layer accurately.

BRIEF DESCRIPTION OF THE DRAWINGS

FIGS. 3A to 7B are cross-sectional views showing a method for manufacturing the semiconductor device according to the embodiment.

DETAILED DESCRIPTION

According to one embodiment, a semiconductor device includes a re-interconnection layer, a plurality of bumps, a plurality of chips, and a resin member. The bumps are provided on a first surface of the re-interconnection layer. The chips are stacked on a second surface of the re-interconnection layer. The resin member is provided on the second surface, and covers the chips. The re-interconnection layer includes an insulating layer, an interconnection, a first via, an electrode layer, a second via. The interconnection is provided in the insulating layer. The first via is provided in the insulating layer and connected to the interconnection. The electrode layer is provided in the insulating layer, formed of a metal material different from a material of the first via, exposed on the first surface, and connected to the first via and the bumps. The second via is provided in the insulating layer, and connected to the interconnection and the chips. A distance between a surface on a side of the first via of the electrode layer and the second surface is shorter than a distance between the first surface and the second surface.

According to another embodiment, a method for manufacturing a semiconductor device is disclosed. The method can include forming an insulating layer, a plurality of first vias, a plurality of interconnections, a plurality of second vias on a support substrate. The first vias is provided in the insulating layer and exposed on a lower surface of the insulating layer. The interconnections are provided in the insulating layer and connected to the first vias. The second vias are connected to the interconnections and exposed on an upper surface of the insulating layer. The method can include stacking a plurality of chips on the insulating layer and connecting the chips to the second vias. The method can include forming a resin member covering the chips on the insulating layer. The method can include removing the support substrate. The method can include forming a recess in a lower surface of the insulating layer by etching exposed surfaces of the first vias. In addition, the method can include forming an electrode layer in the recess, and bonding a bump to the electrode layer. The electrode layer is made of a metal material different from a material of the first vias.

Embodiment will be described hereinafter with reference to the accompanying drawings.

Figure 1:
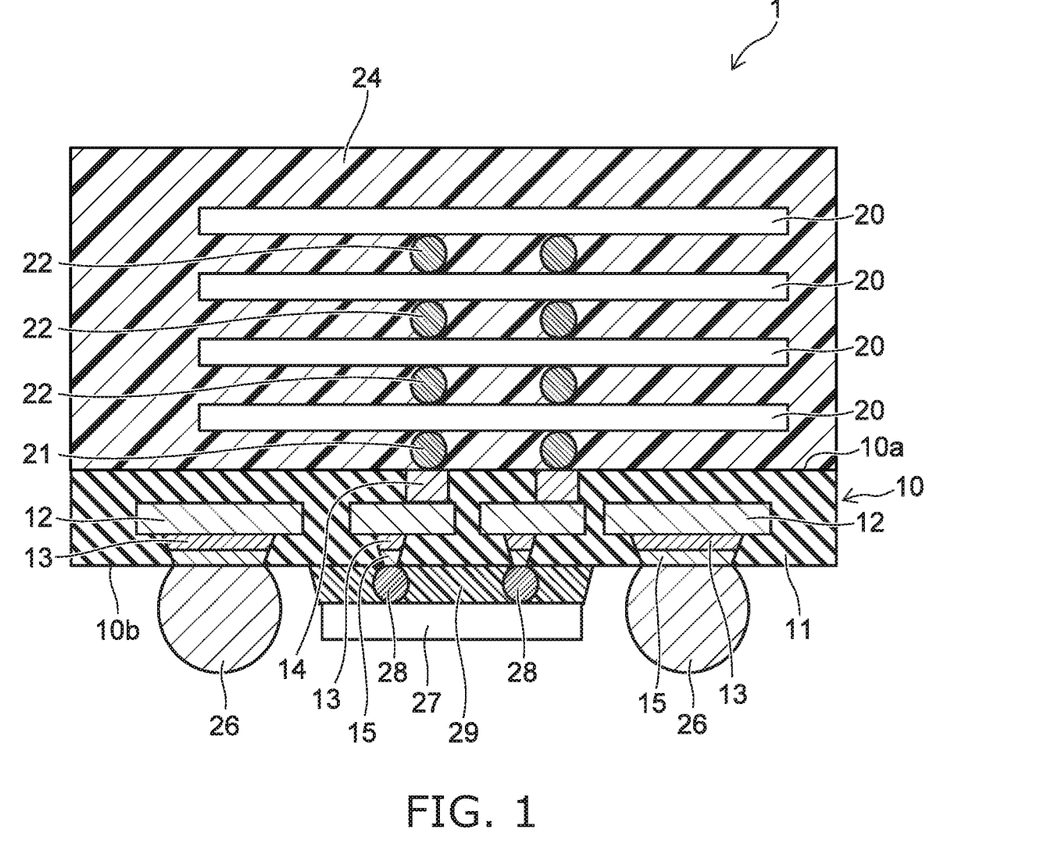
FIG. 1 is a cross-sectional view showing a semiconductor device according to an embodiment.

FIG. 1 is a cross-sectional view showing a semiconductor device according to the embodiment.

Figure 2:
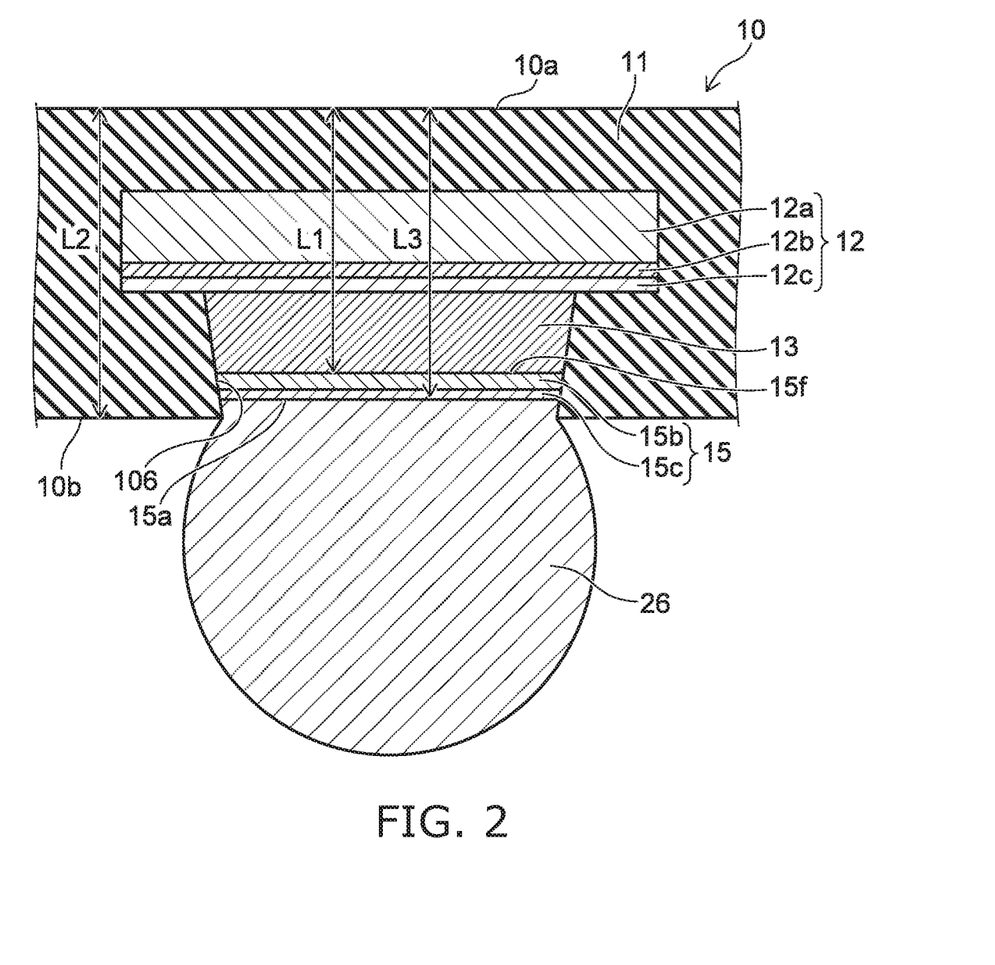
FIG. 2 is a partially enlarged cross-section view showing a portion of a re-interconnection layer of the semiconductor device of the embodiment.

FIG. 2 is a partially enlarged cross-section view showing a portion of a re-interconnection layer of the semiconductor device of the embodiment. p As shown in FIG. 1, a re-interconnection layer 10 is provided in a semiconductor device 1 according to the embodiment. In the re-interconnection layer 10, for example, an insulating layer 11 made of an organic material is provided as a base material. In the re-interconnection layer 10, multiple interconnections 12, multiple vias 13, multiple vias 14 and multiple electrode layers 15 are provided in the insulating layer 11.

The interconnections 12 are made of a metal material, for example, and are buried in the insulating layer 11. The vias 13 are made of a metal material such as copper (Cu), for example, are disposed in the insulating layer 11, and are connected to the interconnections 12. In the following, in the specification, a direction from the interconnections 12 toward the vias 13 is taken as "downward", and the opposite direction is taken as "upward". That is, the vias 13 are disposed below the interconnections 12. The vias 14 are made of a metal material, for example a noble metal, for example a stacked body of a nickel (Ni) layer, a palladium (Pd) layer and a gold (Au) layer. The vias 14 are disposed above the interconnections 12 in the insulating layer 11, and are connected to the interconnections 12. The vias 14 are exposed at an upper surface 10a of the re-interconnection layer 10.

The electrode layers 15 are disposed on a lower surface of the vias 13 in the insulating layer 11, and are connected to the vias 13. The electrode layers 15 are exposed at a lower surface 10b of the re-interconnection layer 10. The electrode layers 15 are made of a metal material different from the material of the vias 13, and include a nobler metal, for example. A thickness of each of the electrode layers 15 is, for example, a few μm (micron).

In the semiconductor device 1, multiple semiconductor chips 20 are provided on the re-interconnection layer 10, and are stacked along a vertical direction. The semiconductor chips 20 are, for example, 3-dimensional NAND type memory chips. The vias 14 of the re-interconnection layer 10 and the semiconductor chip 20 at the bottom level are bonded by micro bumps 21. The adjacent semiconductor chips 20 are bonded by micro bumps 22. In the specification, "being bonded" means a state of being coupled mechanically and being electrically connected each other. A resin member 24 is provided on the upper surface 10a of the re-interconnection layer 10. The resin member 24 is made of a resin material, and covers the stacked semiconductor chips 20, the micro bumps 21 and 22.

In the semiconductor device 1, bumps 26 are provided on the lower surface 10b of the re-interconnection layer 10. The bumps 26 are made of a solder, for example, the diameter is larger than diameters of the micro bumps 21 and 22, and for example, a few hundred μm. The bump 26 is bonded to a lower surface 15a (see FIG. 2) of the electrode layer 15.

A control chip 27 is mounted on the lower surface 10b of the re-interconnection layer 10. The control chip 27 is bonded to the electrode layer 15 of the re-interconnection layer 10 via micro bumps 28. That is, some of the multiple electrode layers 15 are bonded to the bump 26 and others are bonded to the micro bumps 28. A resin member 29 covering the micro bumps 28 is provided between the re-interconnection layer 10 and the control chip 27.

In the semiconductor device 1, electrodes (not shown) of the respective semiconductor chips 20 are connected to the external via the micro bumps 21 and 22, the vias 14, the interconnections 12, the vias 13, the electrode layers 15 and the bumps 26. The control chip 27 functions, for example, as an interface controlling signal exchange between the multiple semiconductor chips 20 and the external, and functions as a controller controlling operation of these semiconductor chips 20.

As shown in FIG. 2, in the interconnection 12, a main body 12a made of copper, for example, is provided, and a copper layer 12b and a titanium layer 12c are provided on a lower surface of the main body 12a. On the other hand, a shape of the stacked body made of the electrode layer 15 and the via 13 is a reverse quadrangular pyramid. That is, the closer to the electrode layer 15, the narrower a width. In the electrode layer 15, a nickel layer 15b and an intermetallic compound layer 15c are stacked in this order from the via 13 side. The nickel layer 15b contacts the via 13, and the intermetallic compound layer 15c contacts the bump 26. The intermetallic compound 15c is made of an intermetallic compound including, for example, copper, tin (Sn) and nickel (Ni) as main components, and may include a noble metal such as palladium (Pd) and gold (Au) or the like.

A distance L1 between an upper surface 15f of the electrode layer 15, namely, a surface on the via 13 side and the upper surface 10a of the re-interconnection layer 10 is shorter than a thickness of the re-interconnection layer 10, namely, a distance L2 between the lower surface 10b and the upper surface 10a of the re-interconnection layer 10. That is, L1<L2. The lower surface 15a of the electrode layer 15, namely, a surface on the bump 26 side is recessed to the lower surface 10b of the re-interconnection layer 10. The lower surface 15a of the electrode layer 15 may configure the same surface as the lower surface 10b of the re-interconnection layer 10. In other words, a distance L3 between the lower surface 15a of the electrode layer 15 and the upper surface 10a of the re-interconnection layer 10 is not more than the distance L2 described above. That is, L3≤L2.

Next, a method for manufacturing the semiconductor device according to the embodiment will be described.

FIGS. 3A to 3D, FIGS. 4A to 4C, FIGS. 5A to 5C, FIGS. 6A to 6C, FIGS. 7A and 7B are cross-sectional views showing the method for manufacturing the semiconductor device according to the embodiment.

Figure 8:
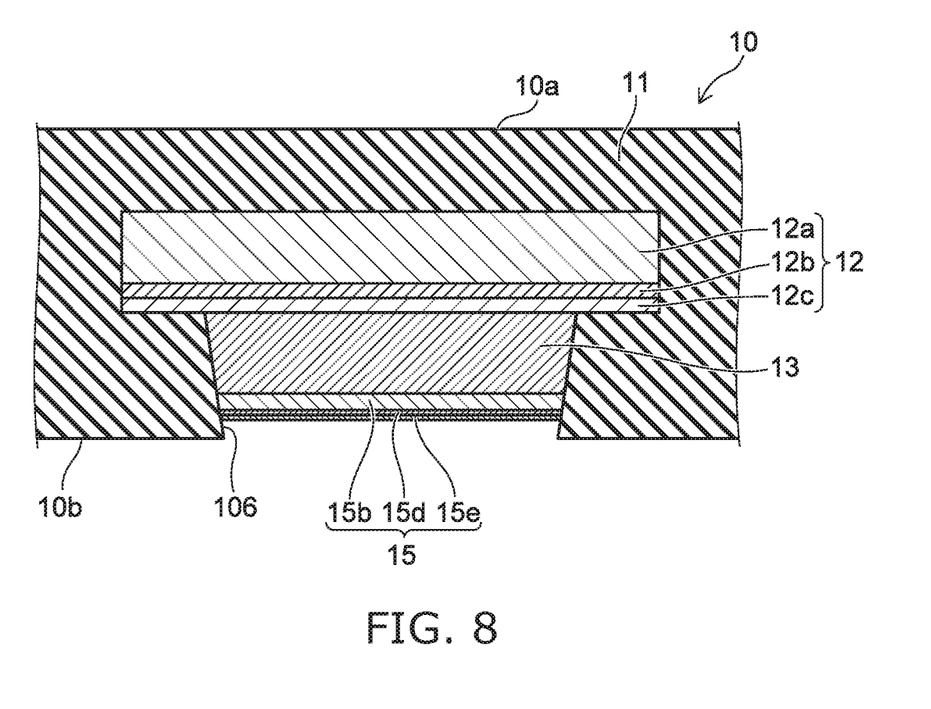
FIG. 8 is a partially enlarged cross-sectional view showing the method for manufacturing the semiconductor device according to the embodiment.

FIG. 8 is a partially enlarged cross-sectional view showing the method for manufacturing the semiconductor device according to the embodiment.

Figure 3A:
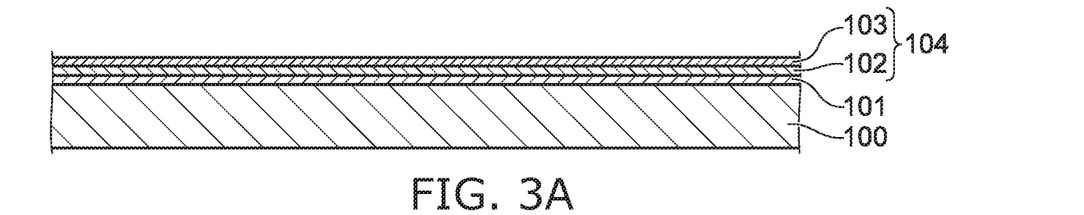

At first, as shown in FIG. 3A, a support substrate 100 is prepared. The support substrate 100 is, for example, a silicon wafer or a glass substrate. Next, a release layer 101 is formed on an upper surface of the support substrate 100. The release layer 101 is made of, for example, an organic material which is solvable in the specific chemical liquid, an organic material generating a decomposition reaction due to light irradiation, or an organic material or an inorganic material which peels off by stress application of not less than a certain amount. Next, a titanium (Ti) layer 102 is formed on the release layer 101, and a copper layer 103 is formed thereon. The titanium layer 102 has high adhesion to the support substrate 100. The titanium layer 102 and the copper layer 103 form a seed layer 104.

Figure 3B:
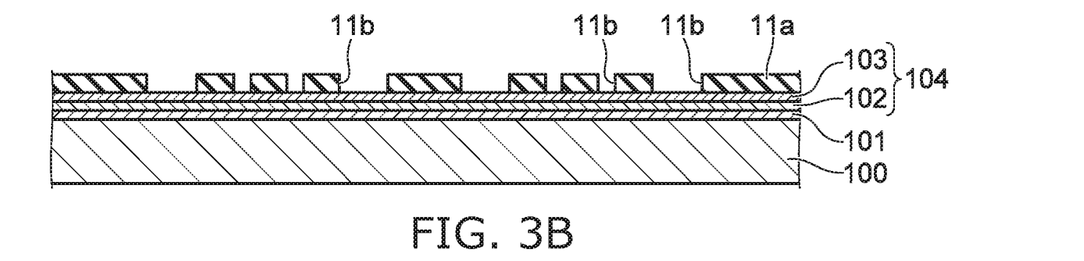

Next, as shown in FIG. 3B, an insulating layer 11a made of, for example, an organic material is formed on the seed layer 104. Next, via holes 11b are formed in the insulating layer 11a by a lithography method or laser irradiation. The seed layer 104 is exposed at bottom surfaces of the via holes 11b.

Figure 3C:
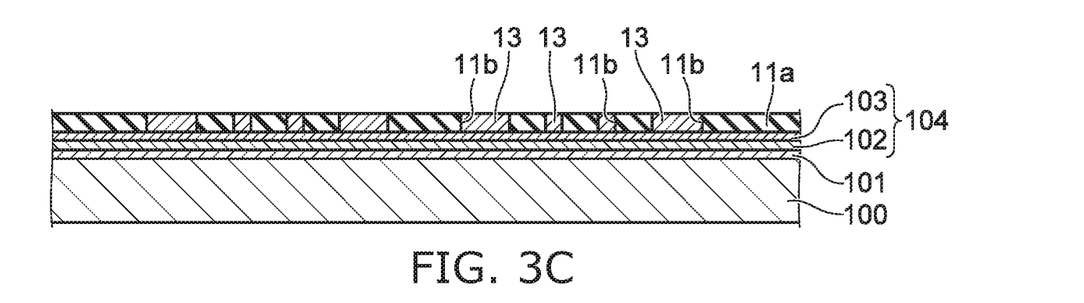

Next, as shown in FIG. 3C, an electrolytic plating is performed via the seed layer 104, and a metal material, for example, copper is buried in the via holes 11b to form the vias 13. At this time, because the copper layer is highly conductive, in the case where a resist pattern 105 described later is formed over a large area, it is easy to make a thickness of the electrolytic plating uniform.

Figure 3D:
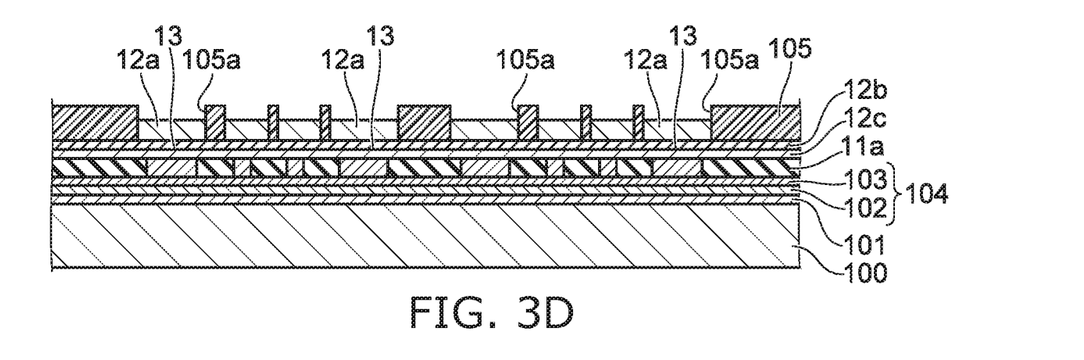

As shown in FIG. 3D, the titanium layer 12c and the copper layer 12b are formed on the insulating layer 11a. Next, the resist pattern 105 is formed on the copper layer 12b. Openings 105a are formed in the resist pattern 105 by the lithography method. A copper layer 12b is exposed at a bottom surface of the openings 105a. Next, the electrolytic plating is performed using the titanium layer 12c and the copper layer 12b as a seed layer, copper is buried in the openings 105a, and the main bodies 12a are formed. Next, the resist pattern 105 is removed. Next, etching is performed, and a portion of the copper layer 12b and the titanium layer 12c not covered with the main bodies 12a is removed. Thereby, the copper layer 12b and the titanium layer 12c are patterned to have the same shape as the main bodies 12a viewed from the above. The interconnections 12 are formed by the main bodies 12a, and the patterned copper layer 12b and titanium layer 12c. The interconnections 12 are connected to the vias 13.

Figure 4A:
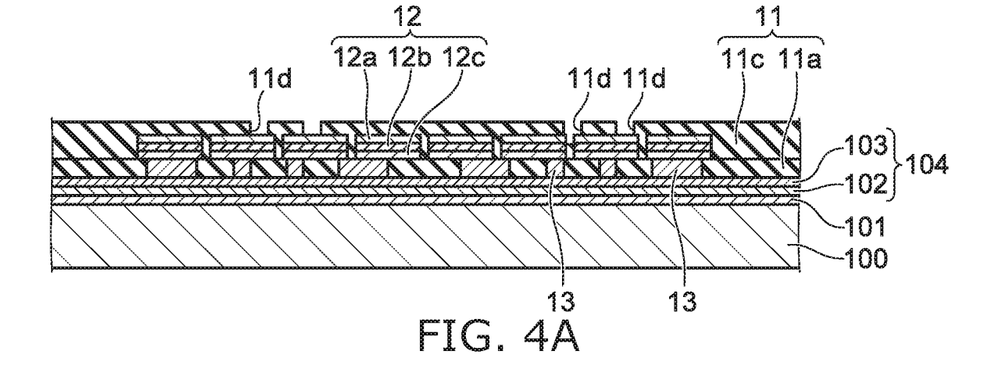

Next, as shown in FIG. 4A, an insulating layer 11c made of, for example, an organic material is formed on the insulating layer 11a and the interconnections 12. The insulating layer 11 is formed of the insulating layer 11a and the insulating layer 11c. Next, via holes 11d are formed in the insulating layer 11c by, for example, the lithography method or the laser irradiation. The interconnections 12 are exposed at bottom surfaces of the via holes 11d.

Figure 4B:
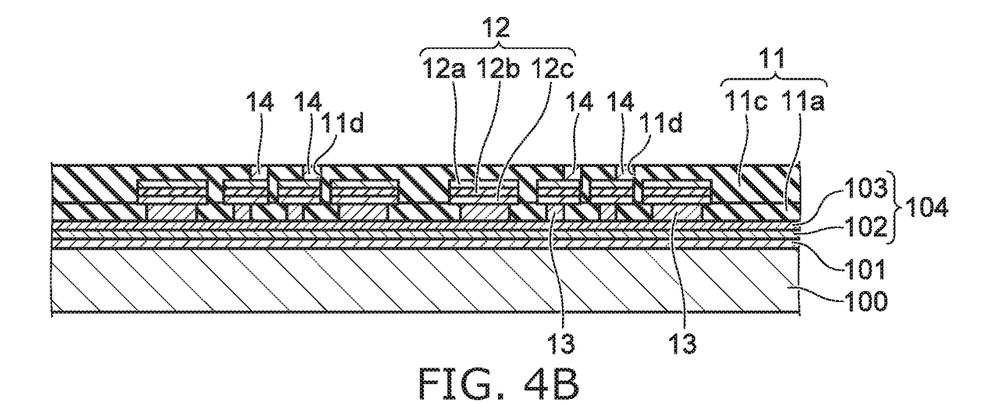

Next, as shown in FIG. 4B, metal materials including a noble metal, for example, a nickel layer, a palladium layer and a gold layer are formed in this order on the exposed surfaces of the interconnections 12 by the electroless plating method. Thereby, a via 14 is formed in the via hole 11d. The vias 14 are connected to the interconnections 12, and are exposed on an upper surface of the insulating layer 11a.

Figure 4C:
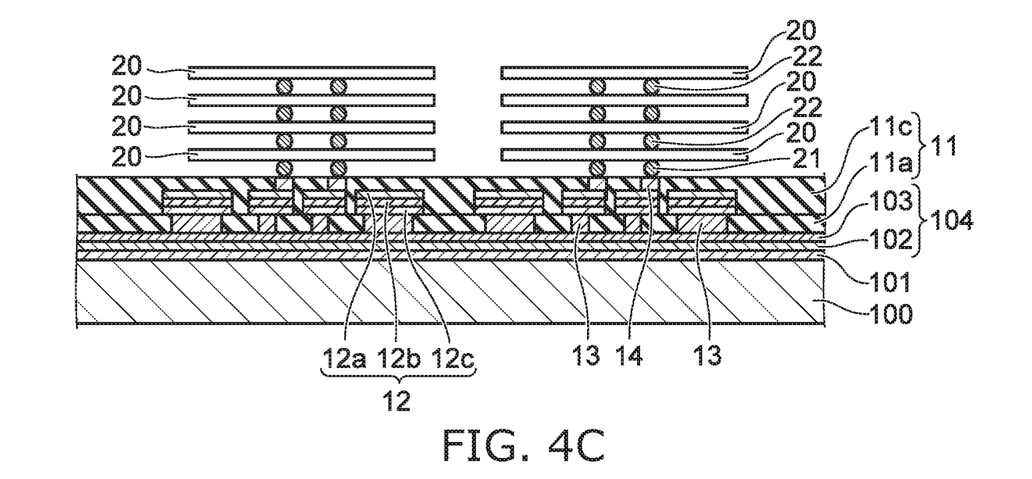

Next, as shown in FIG. 4C, the semiconductor chip 20 is bonded on the vias 14 via the micro bumps 21. Next, the multiple semiconductor chips 20 are stacked on the semiconductor chip 20 via the micro bumps 22. Thereby, the multiple semiconductor chips 20 are stacked on the insulating layer 11. Electrodes (not shown) of the multiple semiconductor chips 20 are connected to the vias 14 via the micro bumps 21 and 22. The stacked body formed of the multiple semiconductor chips 20 bonded beforehand each other via the micro bumps 22 may be bonded to the vias 14 via the micro bumps 21.

Figure 5A:
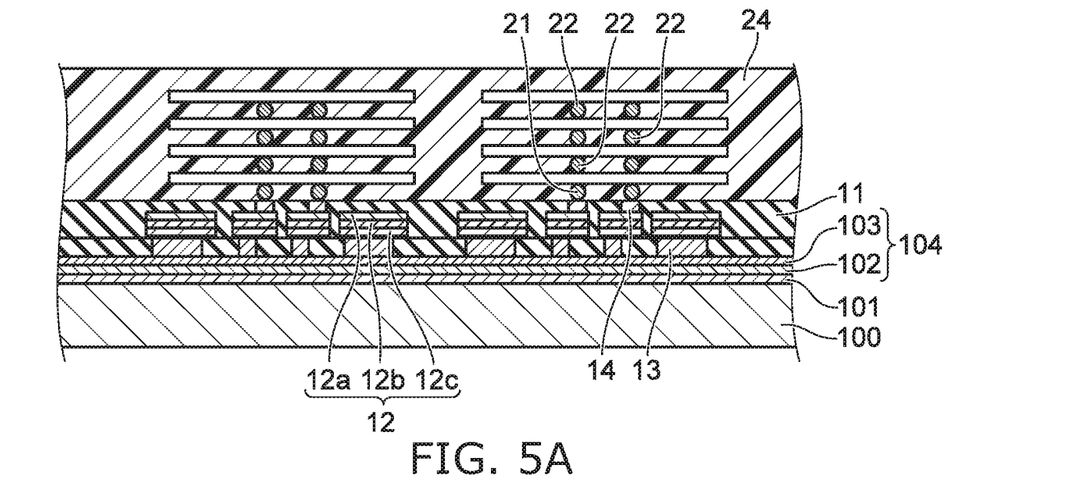

Next, as shown in FIG. 5A, a resin material is molded and formed to cover the stacked body formed of the multiple semiconductor chips 20 on the insulating layer 11, and the resin member 24 is formed by heating and curing at a temperature not higher than 200° C., for example.

Figure 5B:
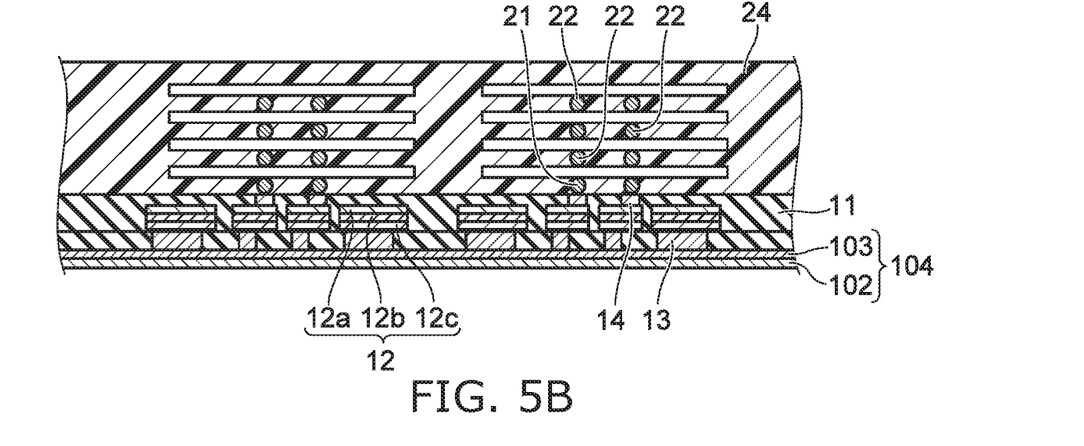

Next, as shown in FIG. 5B, the release layer 101 is removed, for example, by dissolving the release layer using a chemical liquid or decomposing the release layer by light irradiation. Alternatively, the support substrate 100 is peeled off from the release layer 101 with a force greater than adhesion of the release layer 101. Thereby, the support substrate 100 is removed and the seed layer 104 is exposed.

Figure 5C:
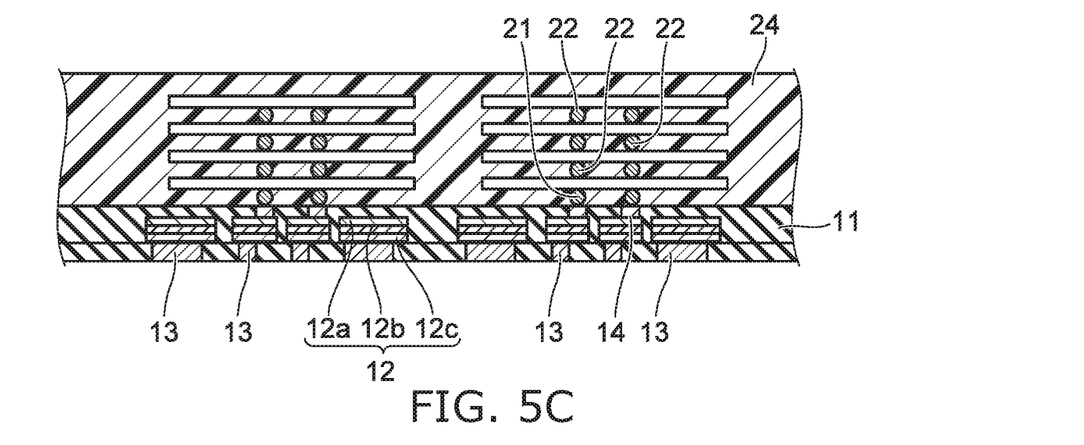

Next, as shown in FIG. 5C, if a residue (not shown) of the release layer 101 is remained on the seed layer 104, it is removed. Next, the seed layer 104 is removed, for example, by a wet etching method. Thereby, the insulating layer 11 and the vias 13 are exposed.

Figure 6A:
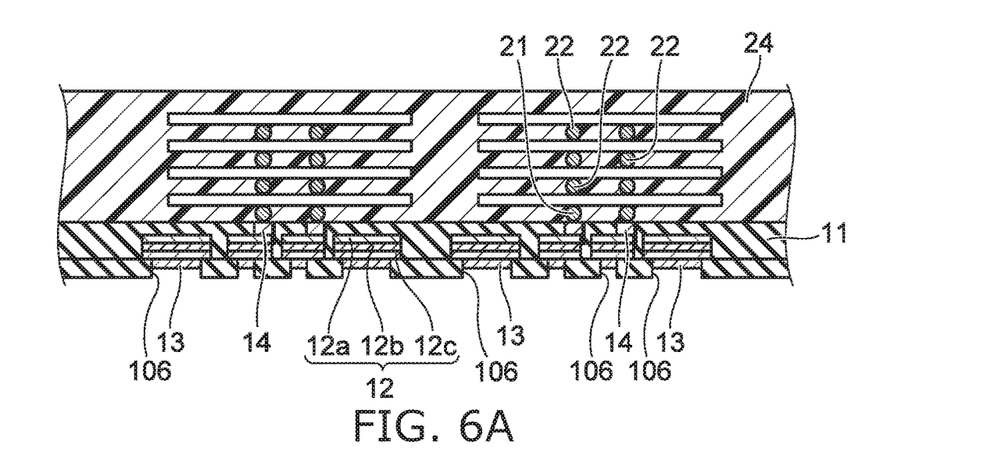

Next, as shown in FIG. 6A, the exposed surfaces of the vias 13 are etched by, for example, the wet etching method. Thereby, a portion of the vias 13 is removed, and recesses 106 are formed on a lower surface of the insulating layer 11. The rest of the vias 13 is exposed on bottom surfaces of the recesses 106. A depth of the recess 106 is, for example, a few μm. In the case of the material of the vias 13 being copper, by controlling the process condition of the copper etching solution, it is possible to remove the entire surface of the copper layer 103 and partly remove the vias 13 by one wet etching process.

Figure 6B:
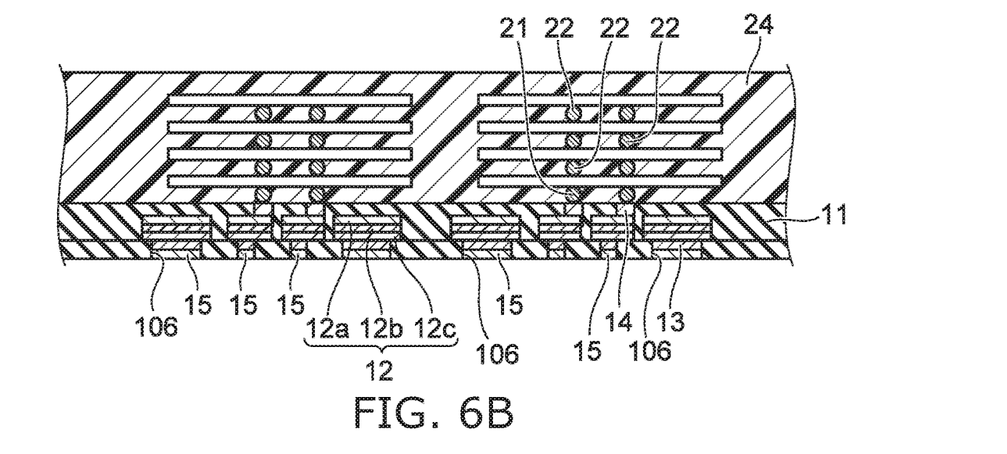

Next, as shown in FIG. 6B and FIG. 8, for example, by the electroless plating method, metal materials different from the material of the vias 13, for example, metal materials including a noble metal, for example, the nickel layer 15b, a palladium layer 15d and a gold layer 15e are formed in this order on the exposed surfaces of the vias 13. Thereby, the electrode layer 15 is formed in the recess 106. At this time, a growth condition of the electrode materials, for example, a temperature and a process time are controlled so that a thickness of the electrode layer 15 does not exceed a removed thickness of the via 13, namely, a depth of the recess 106. The re-interconnection layer 10 is formed of the insulating layer 11, the interconnections 12, the vias 13, the vias 14 and the electrode layers 15. The lower surface 15a of the electrode layer 15 is recessed to the lower surface 10b of the re-interconnection layer 10, or the lower surface 15a configures an identical surface to the lower surface 10b.

Figure 6C:
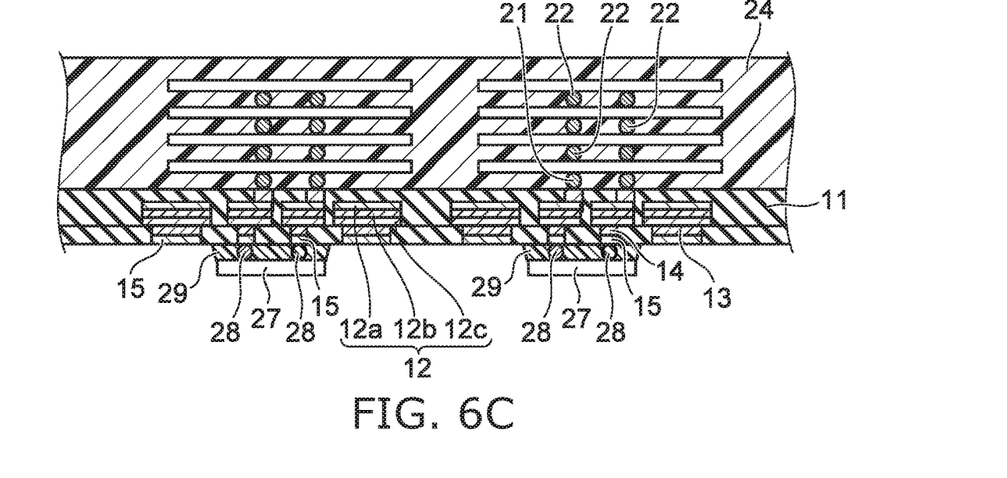

Next, as shown in FIG. 6C, the control chip 27 is bonded to some electrodes 15 via the micro bumps 28. Next, the resin member 29 is formed to cover the micro bumps 28 between the re-interconnection layer 10 and the control chip 27.

Figure 7A:
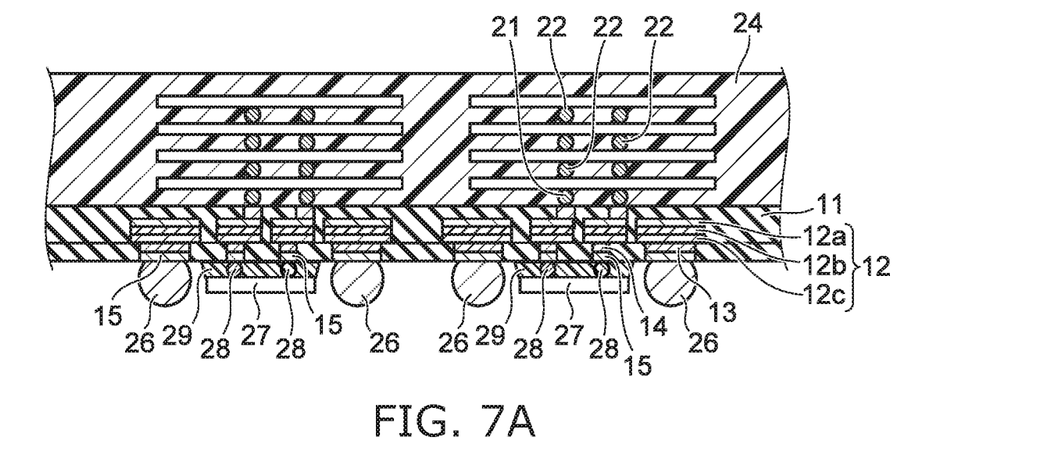

Next, as shown in FIG. 7A, the bumps 26 made of solder, for example, are bonded to the electrode layers 15 to which the micro bumps 28 are not bonded. At this time, as shown in FIG. 8 and FIG. 2, in the electrode layers 15 to which the bumps 26 are bonded, the gold layer 15e and the palladium layer 15d diffuse into the bumps 26 to disappear. On the other hand, the intermetallic compound layer 15c including copper, tin and nickel as main components is formed between the nickel layer 15b and the bumps 26.

Figure 7B:
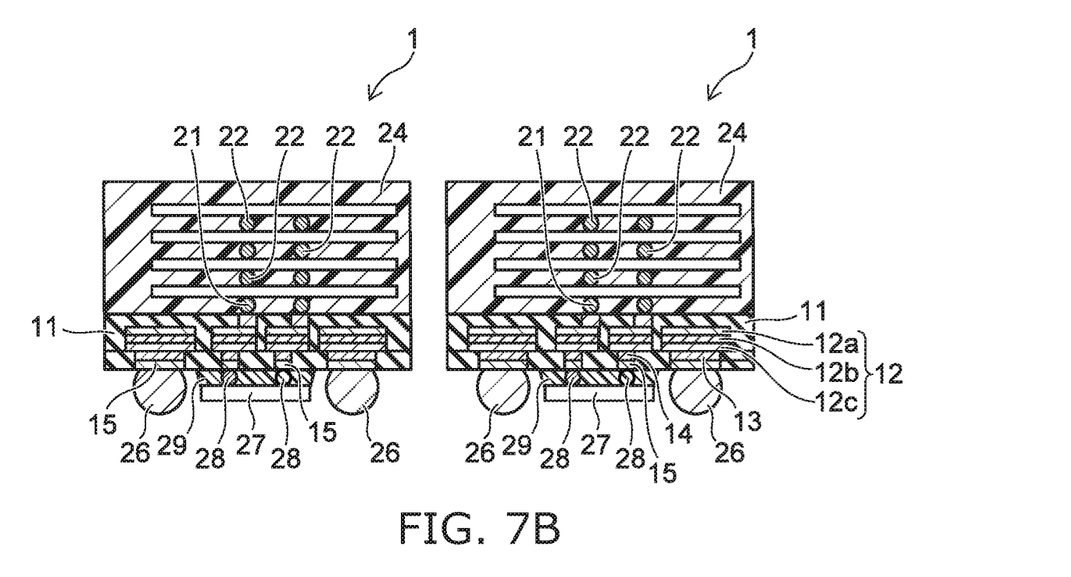

Next, as shown in FIG. 7B, dicing is performed and the re-interconnection layer 10 and the resin member 24 are cut. Thereby, multiple semiconductor devices 1 are manufactured.

Next, the effect of the embodiment will be described. In the embodiment, in the processes shown in FIG. 3A to FIG. 5A, after a structure body made of the insulating layer 11, the stacked body made of the semiconductor chips 20, and the resin member 24 or the like is formed on the support substrate 100, in the process shown in FIG. 5B, the support substrate 100 is removed. In the processes shown in FIG. 5B to FIG. 7A, the electrode layers 15 and the bumps 26 are formed. Thereby, the semiconductor chips 20 can be connected to the bumps 26 via the re-interconnection layer 10. As a result, the semiconductor device 1 can be low profiled in comparison with the case of using the print board.

If the support substrate 100 is removed in the process shown in FIG. 5B, due to a stress generated mainly in the semiconductor chips 20 and a stress when the resin member 24 is heated and cured, warpage may occur in the structure body made of the insulating layer 11, the stacked body made of the semiconductor chips 20 and the resin member 24 or the like. When the stress occurs, positions of the vias 13 shift from design positions. However, in the embodiment, in the process shown in FIG. 6A, the recesses 106 are formed by etching the vias 13, and in the process shown in FIG. 6B, the electrode layers 15 are formed in the recesses 106 by the electroless plating method. In this manner, in the embodiment, even if the positions of the vias 13 shift, the electrode layers 15 can be formed in a self-aligned manner, and thus the position accuracy of the electrode layers 15 is high. Moreover, the electrode layer 15 is formed in the recess 106, and thus the electrode layers 15 do not approach each other with formation of the electrode layers 15, and short circuit between the electrode layers 15 can be suppressed.

On the contrary, if the electrode layers 15 are intended to be formed independently from the vias 13 by, for example, the lithography method and a RIE (Reactive Ion Etching) method or the like, position alignment between the electrode layers 15 and the vias 13 becomes difficult in the case where the positions of the vias 13 are shifted by the warpage of the structure body. If the electrode layers 15 are formed without forming the recesses 106, the electrode layers 15 spread also in a horizontal direction with growth of the electrode layers 15, and thus the electrode layers 15 approach each other and the short circuit may be possible. In order to prevent certainly the short circuit between the electrode layers 15, it is necessary to make a distance between the electrode layers 15 sufficiently long at the design stage, and downsizing of the semiconductor device 1 is hindered.

According to the embodiment described above, a semiconductor device with a high position accuracy of the electrode layers and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a re-interconnection layer;
a plurality of bumps provided on a first surface of the re-interconnection layer;
a plurality of chips stacked on a second surface of the re-interconnection layer; and
a resin member provided on the second surface, the resin member covering the chips,
the re-interconnection layer including
an insulating layer,
an interconnection provided in the insulating layer,
a first via provided in the insulating layer and connected to the interconnection,
an electrode layer provided in the insulating layer, being formed of a metal material different from a material of the first via, and being connected to the first via and the bumps, and
a second via provided in the insulating layer, the second via being connected to the interconnection and the chips,
a distance between a surface on a side of the first via of the electrode layer and the second surface being shorter than a distance between the first surface and the second surface,
a width of the first via becoming narrower from the second surface toward the first surface.

2. The device according to claim 1, wherein
a surface on a side of the bumps of the electrode layer configures an identical surface to the first surface, or is recessed to the first surface.

3. The device according to claim 1, wherein
the electrode layer includes a noble metal.

4. The device according to claim 1, further comprising:
a control chip provided on the first surface, the control chip being connected to the interconnection.

5. A semiconductor device, comprising:
a connecting layer;
a plurality of first bumps provided on a first surface of the connecting layer;
a plurality of chips stacked on a second surface of the connecting layer; and
a resin member provided on the second surface, the resin member covering the chips,
the connecting layer including
an insulating layer,
a plurality of wiring layers provided in the insulating layer,
a first via provided in the insulating layer and connected to one of the plurality of wiring layers,
an electrode layer provided in the insulating layer and being connected to the first via and one of plurality of first bumps, and
a second via provided in the insulating layer, being connected to one of the plurality of wiring layers and the chips,
a surface on the first surface side of the electrode layer being recessed to the first surface,
a width of the first via becoming narrower from the second surface toward the first surface.

6. The device according to claim 5, wherein the electrode layer is formed of a metal material different from a material of the first via.

7. The device according to claim 6, wherein the first via includes copper.

8. The device according to claim 7, wherein the electrode layer includes a nickel layer.

9. The device according to claim 8, further comprising:
an intermetallic compound layer containing gold or palladium, and being provided between the nickel layer and the one of the plurality of first bumps.

10. The device according to claim 5, further comprising:
a control chip provided on the first surface, the control chip being electrically connected to one of the plurality of wiring layers.

11. The device according to claim 10, further comprising:
a plurality of second bumps provided on the first surface of the connecting layer, diameters of the plurality of second bumps being smaller than diameters of the plurality of first bumps,
wherein the control chip is electrically connected to the one of the plurality of wiring layers via at least one of the plurality of second bumps.

* * * * *